(12) United States Patent
Inoue et al.

(10) Patent No.: US 6,926,029 B2
(45) Date of Patent: Aug. 9, 2005

(54) WAFER CONTAINER

(75) Inventors: Kiyotaka Inoue, Kanagawa-ken (JP); Terumi Muguruma, Kanagawa-ken (JP); Yuichi Kuroda, Kanagawa-ken (JP); Noriaki Yoshikawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/006,595

(22) Filed: Dec. 8, 2004

(65) Prior Publication Data

US 2005/0098218 A1 May 12, 2005

Related U.S. Application Data

(60) Division of application No. 10/669,003, filed on Sep. 24, 2003, which is a continuation of application No. 09/605,894, filed on Jun. 29, 2000, now abandoned.

(30) Foreign Application Priority Data

Jun. 30, 1999 (JP) .................................. 11-186768

(51) Int. Cl.⁷ ............................................. B65G 1/133
(52) U.S. Cl. ................ 137/565.23; 141/98; 414/217.1; 26/711
(58) Field of Search .......................... 141/98; 206/710, 206/711; 414/217, 217.1, 939, 940; 137/565.23

(56) References Cited

U.S. PATENT DOCUMENTS

| | | |
|---|---|---|
| 4,724,874 A | 2/1988 | Parikh et al. |
| 4,995,430 A | 2/1991 | Bonora et al. |
| 5,137,063 A | 8/1992 | Foster et al. |
| 5,217,053 A | 6/1993 | Foster et al. |
| 5,273,423 A | 12/1993 | Shiraiwa |
| 5,291,923 A | 3/1994 | Gallagher et al. |
| 5,295,522 A | 3/1994 | DeAngelis et al. |
| 5,320,218 A | 6/1994 | Yamashita et al. |
| 5,378,283 A | 1/1995 | Ushikawa |
| 5,433,574 A | 7/1995 | Kawano et al. |
| 5,482,161 A | 1/1996 | Williams et al. |
| 5,697,750 A | 12/1997 | Fishkin et al. |
| 5,713,711 A | 2/1998 | McKenna et al. |
| 6,123,120 A | 9/2000 | Yotsumoto et al. |
| 6,135,168 A | 10/2000 | Yang et al. |
| 6,261,044 B1 | 7/2001 | Fosnight et al. |
| 6,302,927 B1 | 10/2001 | Tanigawa |

FOREIGN PATENT DOCUMENTS

JP         7-315477        12/1995

*Primary Examiner*—John Rivell
(74) *Attorney, Agent, or Firm*—Oblon, Spivak, McClelland, Maier & Neustadt, P.C.

(57) ABSTRACT

A container for storing substrates capable of shortening the cycle time of the production, improving the production efficiency and reducing the production cost is provided. The container for storing substrates is composed of a box for accommodating the substrates, and a closure member for sealingly closing the box by tightly fixing the closure member to the opening of the box. The container for storing substrates is provided with means for temporarily storing a sealing gas and introducing the sealing gas into the box. Also, the container for storing substrates is provided with means for means for temporarily forming a low pressure space for the purpose of evacuating the gas inside of the box by transferring the gas to the low pressure space.

9 Claims, 15 Drawing Sheets

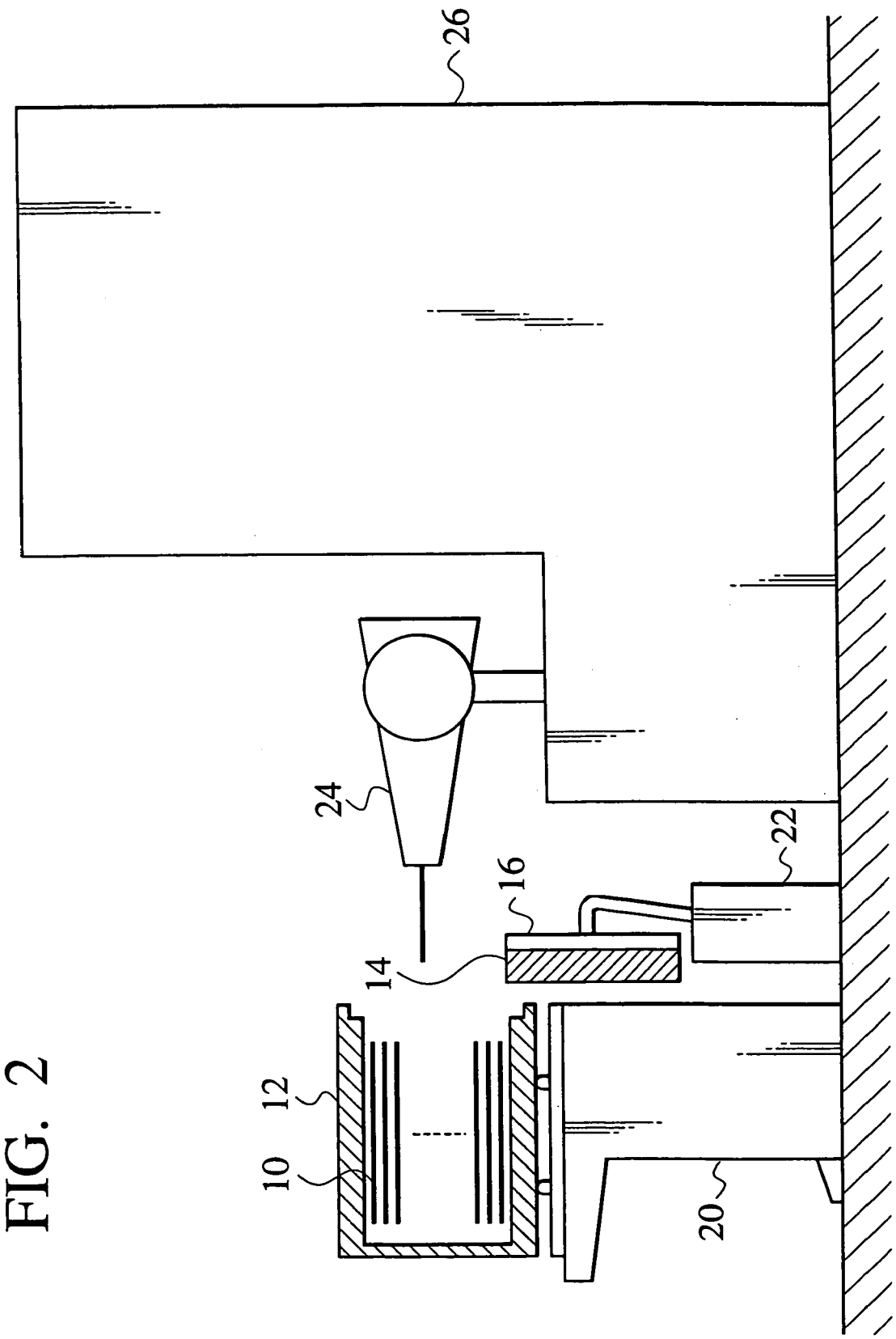

WAFER CONTAINER

CROSS REFERENCE TO THE RELATED APPLICATION

The subject application is related to subject matter disclosed in the Japanese Patent Application No.Hell-186768 filed in Jun. 30, 1999 in Japan, to which the subject application claims priority under the Paris Convention and which is incorporated by reference herein.

BACKGROUND OF THE INVENTION

1. Field of the Invention

The present invention is related generally to a transportable container for storing substrates such as a semiconductor wafer transportation pod for accommodating a stack of semiconductor wafers. In particular, the present invention is related to a SMIF (Standard Mechanical Interface)-type semiconductor wafer transportation system for accommodating a stack of semiconductor wafers in a SMIF-type box and transporting the stack of semiconductor wafers between the process chambers.

2. Description of the Related Art

It is a very important gist in the semiconductor production line to improve the device yield. The major causes of lessening the device yield is the existence of contaminant particles consisting of dust, organic substances and so forth. In the prior art technique, it is the measure for meeting the contaminant particles problem to conduct the LSI production processes within a clean room. However, the size of the contaminant particles to be eliminated has been decreased along with the miniaturization of LSIs and the rapidly increasing packing densities and therefore it is difficult to furthermore purify the clean room environment itself in view of avoiding an increase in costs. It is therefore proposed to make use of an SMIF-type system provided with a sealed wafer pod in place of an open cassette which has been used in the prior art technique of the semiconductor wafer transportation. By means of the wafer pod, it is possible to maintain dust-free wafers because the wafers can be accepted, transported and stored in a sealed box implemented with the wafer pod. Furthermore, even if the environment around the process chambers is not so purified, it is possible to conduct the wafer transportation between the process chambers with the wafers free from contaminant particles.

FIG. 1A is a schematic diagram showing the wafer transportation by means of a semiconductor wafer transportation pod which is placed on a wafer pod table 20 for carrying in or out the semiconductor wafers 10. As illustrated in FIG. 1A, in the case of the prior art semiconductor wafer transportation pod, the pod lid 14b is detached from the wafer pod body 12 when the wafers 10 are carried out from the semiconductor wafer transportation pod and carried in an semiconductor process chamber (not shown in the figure). The detachment of the pod lid 14b is performed by means of a lid opening/closing control means 22 provided with a pod lid shutting device 16b. Inversely, when the wafers 10 are carried in the wafer pod body 12 after the wafers 10 have been processed in the semiconductor process chamber, the lid opening/closing control means 22 then serves to attach the pod lid 14b to the wafer pod body 12 in order to sealably close the wafer pod body 12.

On the other hand, in the recent years, there have been demands for protecting the surface of the semiconductor wafers from the generation of natural oxide films by means of the semiconductor wafer transportation pod in addition to demands for excluding contaminant particles. The natural oxide films are undesirable resulting in unexpected troubles during a process so that it is desirable to be able to avoid the formation thereof. Particularly, substantial adverse effects are likely in the case of highly miniaturized LSIs. Because of this, for the purpose of avoiding the generation of natural oxide films, it is proposed to fill the wafer pod with an inactive gas such as nitrogen ($N_2$), argon (Ar) and so forth and to transport the wafer pod as it is.

Namely, as illustrated in FIG. 1B, an inactive gas such as nitrogen is injected into the wafer pod body 12 through the attachment 18 after sealing and fixing the pod lid 14b to the wafer pod body 12. The wafer pod is then transported with the atmosphere of the inactive gas inside of the wafer pod body 12. The surfaces of the semiconductor wafers 10 shall not be exposed to oxygen but only be exposed to nitrogen during the transportation between the process chambers. Accordingly, it is possible to protect the surfaces of the wafers 10 from the generation of natural oxide films. The semiconductor wafers 10 are also protected from the generation of natural oxide films even in the case that the wafer pod is temporarily stored in a stocker together with the semiconductor wafers 10 therein.

However, it takes, for example, about 10 minutes to completely fill the wafer pod body 12 with the inactive gas in the case that the semiconductor wafer transportation pod has been designed to accommodate 25 wafer having a diameter of 300 mm.

Because of this, (1) the wafer pod can not be transported to the next semiconductor process chamber just after collecting and transferring the semiconductor wafers 10 into the wafer pod. Namely, the transportation of the wafer pod is delayed by the gas filling time. At the present time, the manufacture process of a semiconductor device is composed of a large number of manufacturing steps in the order of 200 steps, and therefore, if 10 minutes is required for each manufacturing step, it takes about total 33 hours required of the gas filling time for the entire 200 manufacturing steps. Accordingly, there is a problem that the cycle time required for completing all the manufacturing steps is elongated by the gas filling time resulting in deteriorating the effectiveness of the manufacture process, and then an increase in costs.

Furthermore, (2) the next wafer pod can not be placed on the wafer pod table 20 during the period that the previous wafer pod is being filled with the gas. Namely, the process of the next wafer pod is therefore delayed by the gas filling time of the previous wafer pod. On the other hand, the semiconductor process chamber of the subject manufacturing step is left idling during the period that the previous wafer pod is being filled with the gas so that the process chamber is used in an ineffective manner. The accumulated loss time is considered to be substantial. Furthermore, even if there are a plurality of the wafer pod tables 20 available in the system, it is the case that all the wafer pod tables 20 are in use. In this case, the process of a wafer pod as transported is delayed until one of the wafer pods has been completely filled with the gas. Accordingly, in the same manner as the above (1), it results in elongating the cycle time required for completing all the manufacture process and deteriorating the effectiveness of the manufacture process, and then an increase in costs.

SUMMARY OF THE INVENTION

The present invention has been made in order to solve the shortcomings as described above. It is an object of the present invention therefore to provide a container for storing substrates capable of shortening the cycle time of the production, improving the production efficiency and reducing the production cost is provided.

In order to accomplish the above and other objects, in accordance with the first aspect of the present invention, a transportable container for sealingly enclosing substrates, the container comprises a box having an opening and receiving the substrates therein; a removable closure member received by the box and capable of closing the box; and a sealing gas introduction system temporarily having a source of a sealing gas to be introduced to purge an interior of the box.

In accordance with the first aspect of the present invention, for example, the closure member is provided with a gas holding vessel in which the sealing gas has been injected in advance. The sealing gas is then introduced into the box in order to purge the interior of the box. Namely, in accordance with the first aspect of the present invention, the sealing gas is injected to the gas holding vessel during the period after the substrates are carried out from the box and before the substrates are carried again in the box. The sealing gas as held in the gas holding vessel is then introduced into the box after starting transportation of the box. By this configuration, the sealing gas introduction step to the box can be recognized to virtually disappear. Accordingly, there is no need for an extra time as required to inject the sealing gas to the box so that the transportation of the wafer pod can be accelerated by the extra time which has been dispensed with. As a result, the cycle time required for completing all the manufacture process can be shortened to realize the improvement of the production efficiency and the reduction of the production cost.

The second aspect of the present invention resides in a transportable container for sealingly enclosing substrates, the container comprising a box having an opening and receiving the substrates therein; a removable closure member for received by the box and capable of closing the box; and an exhaustion system temporarily having a low pressure space whose pressure is lower than a pressure of a surrounding environment outside the container for exhausting a gas from an interior of the box by connecting the low pressure space to the interior of the box.

In accordance with the second aspect of the present invention, for example, the closure member is provided with a vacuum chamber which is evacuated to a pressure which is lower than the pressure of the atmosphere to some extent, i.e., "in a vacuum condition", in order to evacuate the interior of the box by connecting the vacuum chamber to the interior of the box, which is therefore in a vacuum condition thereafter. Namely, in accordance with the second aspect of the present invention, the vacuum chamber is evacuated in advance during the period after the substrates are carried out from the box and before the substrates are carried in the box. The box is then evacuated by means of the vacuum chamber during the transportation of the box. By this configuration, the evacuation step of the box can be recognized to virtually disappear. Accordingly, there is no need for an extra time as required for the evacuation of the box. As a result, the cycle time required for completing all the manufacture process can be shortened to realize the improvement of the production efficiency and the reduction of the production cost. Furthermore, in accordance with the second aspect of the present invention, it is possible to maintain the sealed structure of the box for a longer time and therefore the substrates as stored in the box can be maintained in a highly purified environment for a longer time.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF DRAWINGS

FIG. 2 is a schematic diagram showing the procedure of transferring semiconductor wafers from a semiconductor wafer transportation pod in accordance with the present invention to a semiconductor process chamber.

DESCRIPTION OF THE PREFERRED EMBODIMENTS

Figure 1A:
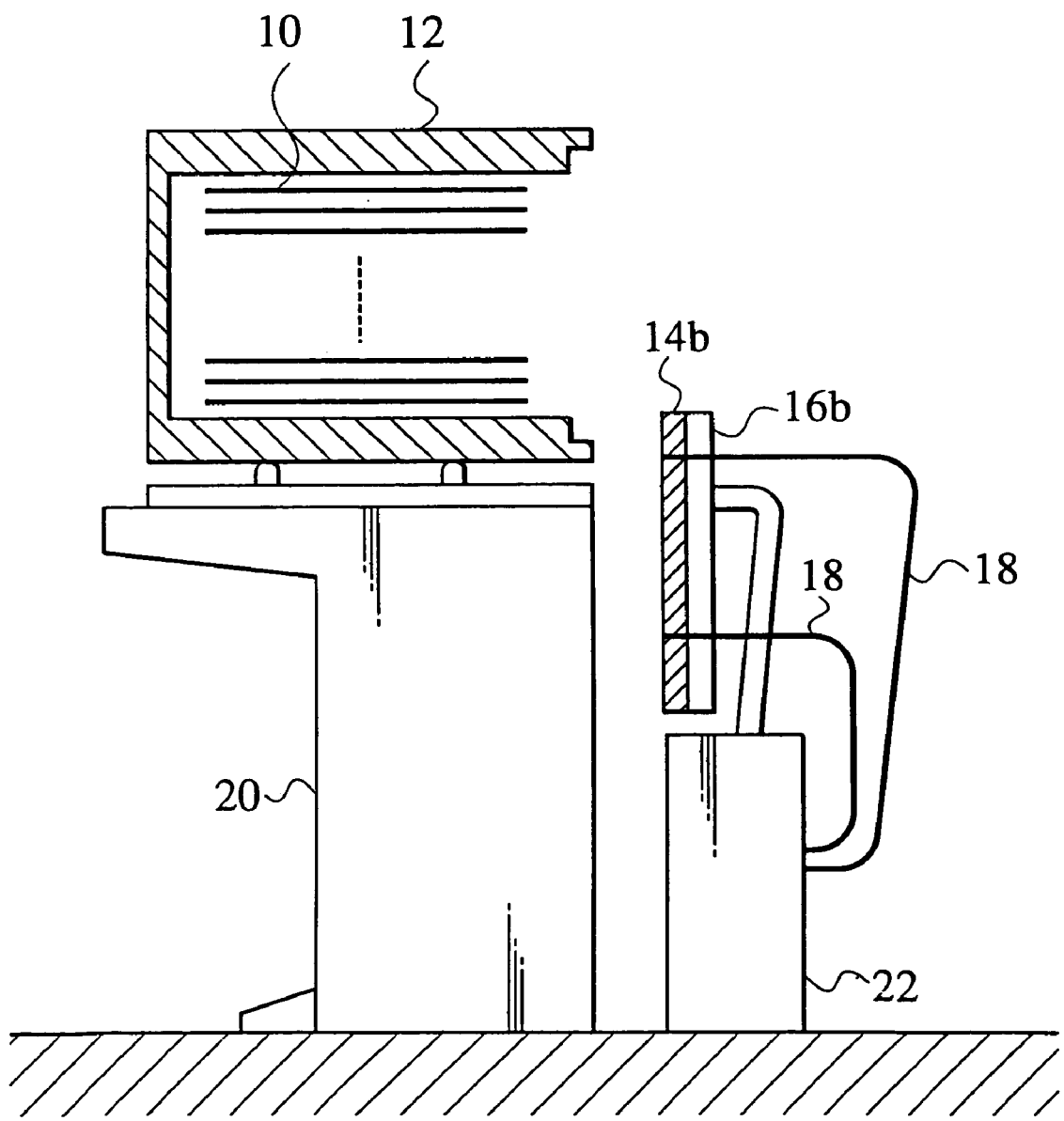
FIG. 1A is a schematic diagram showing the procedure of transferring semiconductor wafers from a semiconductor wafer transportation pod to a semiconductor process chamber in accordance with a prior art technique.
Figure 1B:
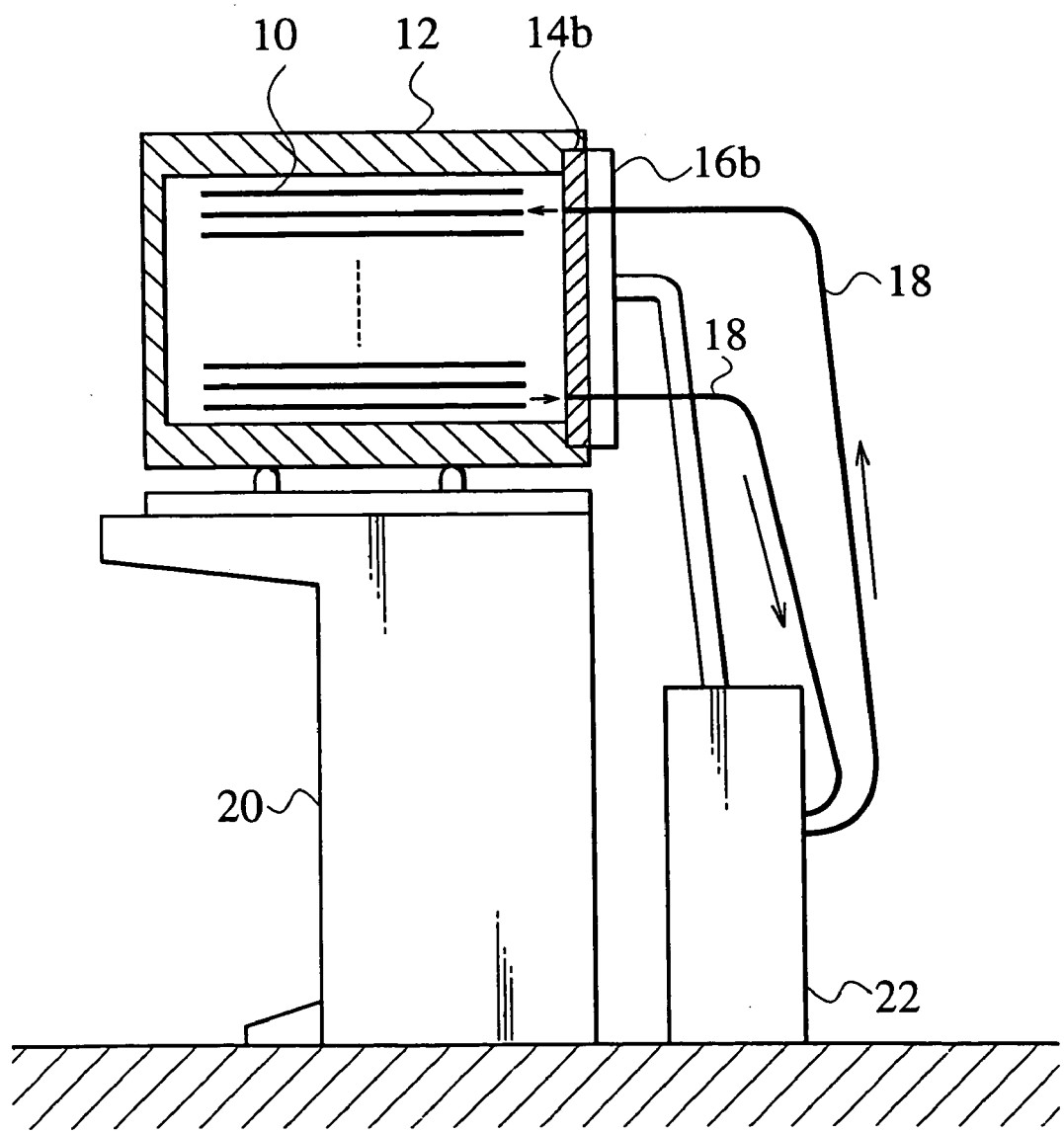
FIG. 1B is a schematic diagram showing the procedure of the injection of a sealing gas to a semiconductor wafer transportation pod in accordance with the prior art technique.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As illustrated in FIG. 2, a semiconductor wafer transportation pod in accordance with the present invention is placed on a wafer pod table 20 located in front of a semiconductor process chamber 26 when semiconductor wafers 10 are carried out from the semiconductor process chamber 26 or are carried in the semiconductor process chamber 26. In usual cases, 2 to 4 wafer pod tables 20 are assigned to one semiconductor process chamber 26. The wafer pod table 20 is used to support the semiconductor wafer transportation pod that is transported from the previous semiconductor process chamber 26 for use in the previous manufacturing step. The pod lid 14 is detached from the wafer pod body 12 after placing the wafer pod. The detachment of the pod lid 14 is performed by means of the lid opening/closing control means 22. The lid opening/closing control means 22 is also used to fix the pod lid 14 to the wafer pod body 12. In another case, these procedures may be manually conducted. The lid opening/closing control means 22 is provided with a pod lid shutting device 16 so that the detachment and the attachment of the pod lid 14 is performed by coupling the pod lid shutting device 16 with the pod lid 14.

After the detachment of the pod lid 14 is completed, a wafer transfer means 24 provided for the semiconductor process chamber 26 serves to transfer, one after another, the semiconductor wafers 10 located in the wafer pod body 12 to the semiconductor process chamber 26. The semiconductor process chamber 26 is used to perform a semiconductor manufacturing step such as the ion-implantation step, the diffusion step, the photolithography step, the thin film formation step, the etching step or the like. After completion of the manufacturing step, the semiconductor wafer 10 is then transferred from the semiconductor process chamber 26 to the wafer pod body 12 by means of the wafer transfer means 24. When all the wafers 10 have been processed in the current manufacturing step and transferred to the wafer pod body 12, the pod lid 14 is sealingly fixed again to the wafer pod body 12 by means of the lid opening/closing control means 22. The wafer pod is then transported to the next semiconductor process chamber for the subsequent manufacturing step, for example, by means of operator's hands, a transportation machine on the floor such as AGV(Automated Guided Vehicle), RGV(Rail Guided Vehicle) or the like, or a transportation machine on the ceiling such as OHT(Overhead Transpotation) or the like.

Figure 3A:
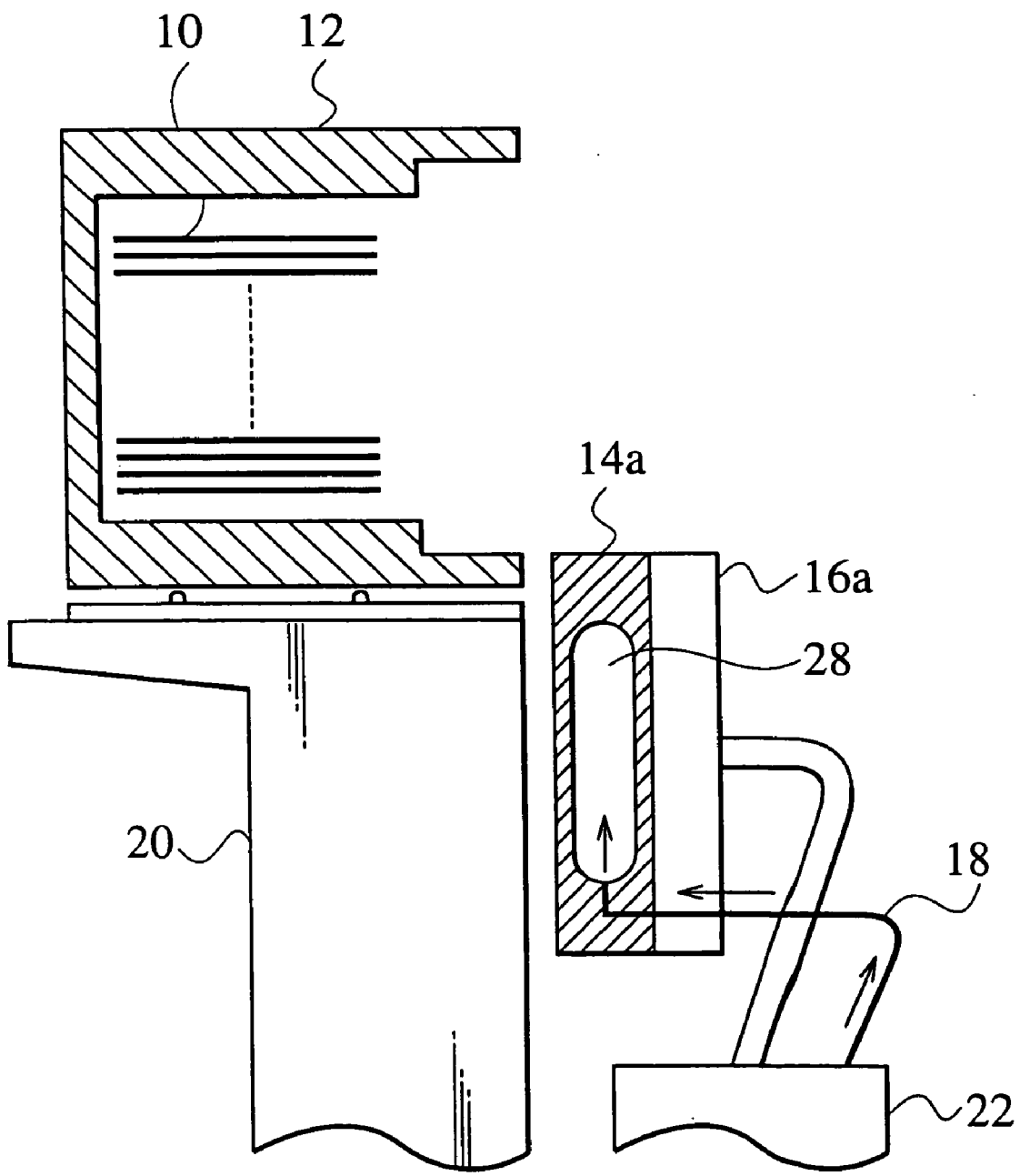
FIG. 3A is a schematic diagram showing the procedure of transferring semiconductor wafers to a semiconductor process chamber from a semiconductor wafer transportation pod in accordance with a first embodiment of the present invention.
Figure 3B:
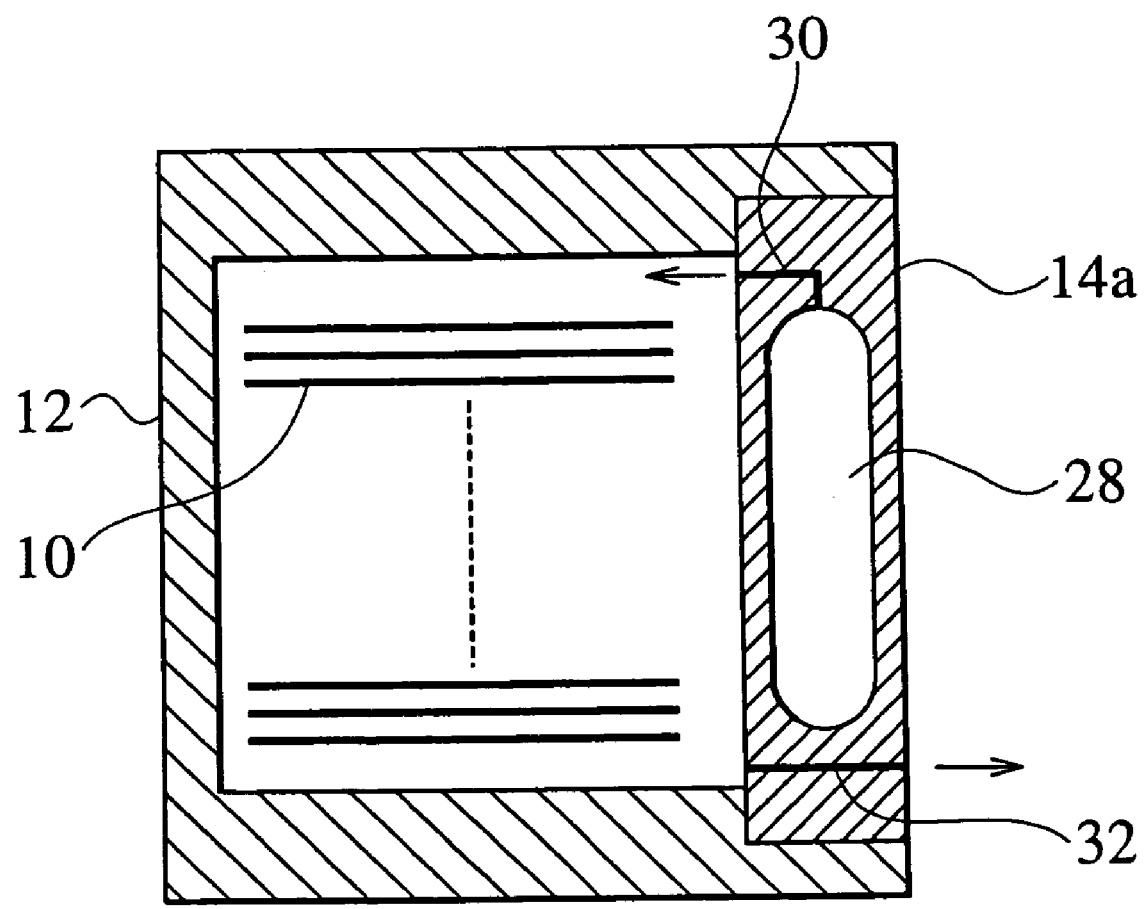
FIG. 3B is a schematic diagram showing the semiconductor wafer transportation pod in accordance with the first embodiment of the present invention which is transported between the process chambers.

FIG. 3A is a schematic diagram showing the wafer transportation by means of the semiconductor wafer transportation pod which is designed in accordance with a first embodiment of the present invention and placed on the wafer pod table 20 for carrying in or out the semiconductor wafers 10. FIG. 3B is a schematic diagram showing the semiconductor wafer transportation pod in accordance with the first embodiment of the present invention which is transported between the process chambers.

As illustrated in FIG. 3A, the semiconductor wafer transportation pod in accordance with the first embodiment of the present invention is composed of the wafer pod body 12 for accommodating and storing the wafers 10 and transporting the semiconductor wafers 10 between the process chambers, and the pod lid 14a sealingly fixed to the wafer pod body 12 in order to tightly close the interior of the wafer pod body 12. The wafer pod body 12 is provided with an opening located on a side wall for carrying in/out the semiconductor wafers 10 and composed of an appropriate material which outputs few particles. The opening is adapted to be engaged with the pod lid 14a in order to sealingly close the interior of the wafer pod body 12. Not shown in the figure, the wafer pod body 12 is provided with a plurality of grooves aligned in the horizontal direction and arranged in parallel to each other with a constant interval in order to directly accommodate a plurality of the wafers 10, for example, 13 wafers, 25 wafers and so on. The wafer pod body 12 is also provided with a handling grip(s) located on the other side walls, the upper wall, or the bottom wall. An operator or a transportation robot can carry the wafer pod for transportation by means of the handling grip.

The pod lid 14a is formed with a gas holding vessel 28 which constitutes the important feature of the present invention. The gas holding vessel 28 is provided for temporarily holding an sealing gas with which the wafer pod body 12 is filled. The sealing gas is injected to the gas holding vessel 28 by the lid opening/closing control means 22. After the pod lid 14a formed with the gas holding vessel 28 is detached from the wafer pod body 12, the attachment 18 is connected to the pod lid 14a through the pod lid shutting device 16a. The sealing gas is transferred to the pod lid 14a from the lid opening/closing control means 22 through the attachment 18 and injected to the gas holding vessel 28 through a conduit formed inside of the pod lid 14a. The gas holding vessel 28 serves to temporarily hold a sufficient amount of the sealing gas for completely replacing the resident gas in the wafer pod body 12. The sealing gas is held in the gas holding vessel 28 in a compressed condition at a constant pressure. The sealing gas is an inactive gas such as nitrogen, argon.

On the other hand, as illustrated in FIG. 3B, the sealing gas in the gas holding vessel 28 is then injected to the wafer pod body 12 during the transportation of the wafer pod. While the sealing gas is injected to the wafer pod body 12 through the conduit 30 inside of the pod lid 14a, the residual gas inside of the wafer pod body 12 is exhausted to the outside through a conduit 32 inside of the pod lid 14a. By this configuration, the residual gas inside of the wafer pod body 12 is completely replaced by the sealing gas after a certain time elapses.

Next, the operation of the first embodiment of the present invention will be explained with reference to FIG. 3A and FIG. 3B. The operation of the first embodiment of the present invention consists generally of the following two operations.
(1) Injection of the sealing gas to the gas holding vessel 28.
(2) Injection of the sealing gas to the wafer pod body 12.

Firstly, in accordance with the first embodiment of the present invention, the procedure of the injection of the sealing gas to the gas holding vessel 28 is performed during the step of carrying out the semiconductor wafers 10 from the wafer pod body 12, the step of processing the semiconductor wafers 10 and the step of carrying the semiconductor wafers 10 into the wafer pod body 12 as illustrated in FIG. 3A. In the prior art technique, the pod lid 14a is left supported by the pod lid shutting device 16a without any operation during the step of carrying out, the step of processing the semiconductor wafers 10 and the step of carrying in. However, in accordance with the first embodiment of the present invention, the sealing gas is injected to the gas holding vessel 28 by making use of the inoperative periods in parallel with these steps. The injection step can be completed within the step of processing the semiconductor wafers 10. Accordingly, there is no need for an extra time as required to complete the injection of the sealing gas to the gas holding vessel 28.

Next, as illustrated in FIG. 3B, the injection of the sealing gas to the wafer pod body 12 is then performed during the transportation of the wafer pod. After transferring the semiconductor wafers 10, the wafer pod is transported to the next process chamber used in the subsequent manufacturing step by means of an appropriate transportation system (not shown in the figure). The sealing gas inside of the gas holding vessel 28 is then transferred to the wafer pod body 12 during the transportation. Since the sealing gas is held in the gas holding vessel 28 at a certain pressure, it is transferred to the wafer pod body 12 through the conduit 30 by its pressure when a valve is opened. The residual gas inside of the wafer pod body 12 is exhausted to the outside of the wafer pod at the same time so that the interior of the wafer pod body 12 finally becomes in a sealing gas atmosphere. The gas injection time for injecting the sealing gas to the wafer pod body 12 is about 10 minutes in the case that the semiconductor wafer transportation pod has been designed to accommodate 25 wafer having a diameter of 300 mm. Accordingly, from the overall view point, the injection step can be recognized as completed just after starting the transportation of the wafer pod. In the prior art technique, the injection to the wafer pod body 12 is conducted before the transportation of the wafer pod. Because of this, the transportation of the wafer pod is delayed by the gas injection time and therefore resulting in elongating the cycle time required for completing all the manufacture process. In accordance with the first embodiment of the present invention, the wafer pod body 12 is filled with the sealing gas which has been temporarily stored in the gas holding vessel 28 during the transportation of the wafer pod. By this configuration, there is virtually no additional time required for the injection step to the wafer pod body 12.

In accordance with the first embodiment of the present invention, the injection of the sealing gas to the wafer pod body 12 is carried out in steps of (1) injecting the sealing gas to the gas holding vessel 28 inside of the pod lid 14a in order to temporarily store the sealing gas, and (2) transferring the sealing gas as stored in the gas holding vessel 28 to the wafer pod body 12 in order to replace the residual gas inside of the wafer pod body 12. Also, in accordance with the first embodiment of the present invention, the injection of the sealing gas to the gas holding vessel 28 is performed during the step of carrying out the semiconductor wafers 10 from the wafer pod body 12, the step of processing the semiconductor wafers 10 and the step of carrying the semiconductor wafers 10 into the wafer pod body 12. Accordingly, there appears no time required for the injection steps (1) and (2) to be added to the cycle time required for completing all the manufacture process. By this configuration, the cycle time is shortened resulting in the improvement of the production efficiency and reduction of the production cost.

Figure 4:
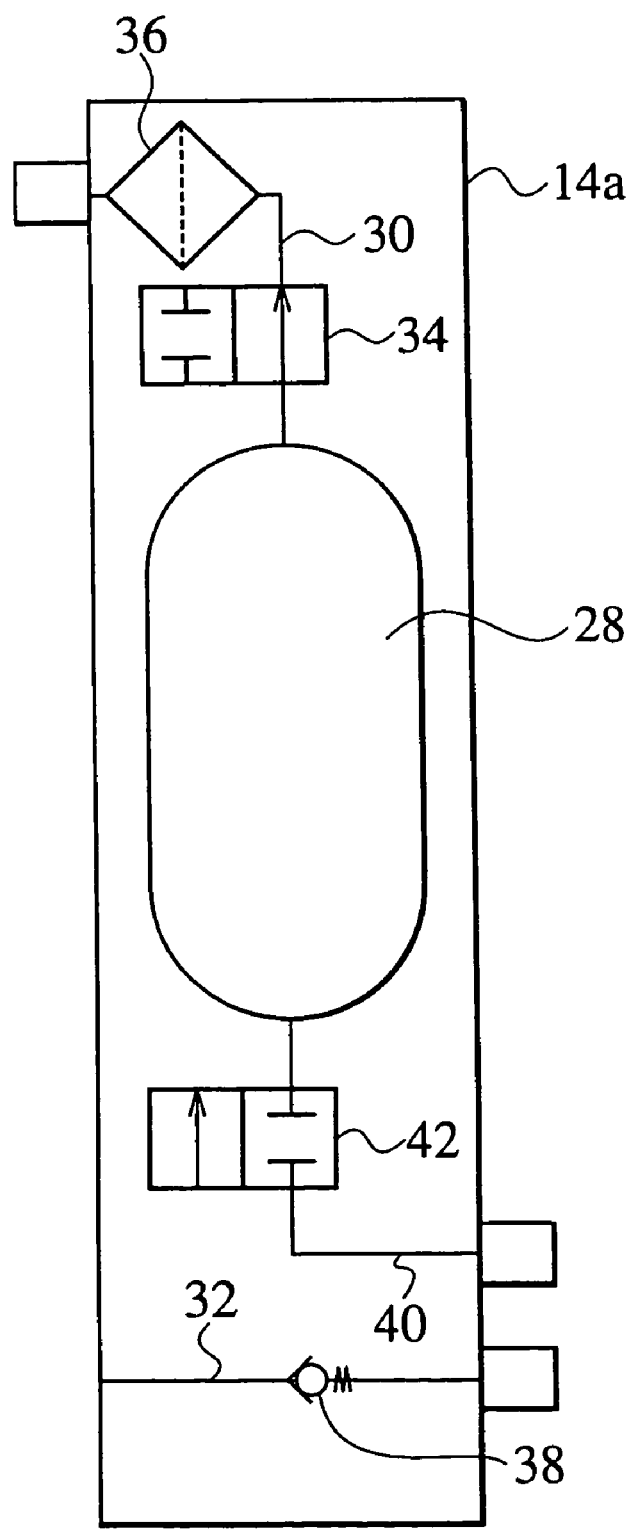
FIG. 4 is a cross sectional view showing the configuration of the pod lid in accordance with the first embodiment of the present invention.

The pod lid 14a in accordance with the first embodiment of the present invention is designed for example as illustrated in FIG. 4. FIG. 4 is a cross sectional view showing the configuration of the pod lid 14a in accordance with the first embodiment of the present invention. As illustrated in FIG. 4, the pod lid 14a in accordance with this embodiment of the present invention is composed therein of the gas holding vessel 28, the conduit 30 for injecting the sealing gas inside of the gas holding vessel 28 to the wafer pod body 12, an opening/closing valve 34 and a filter 36 which are provided in the middle of the conduit 30, a conduit 40 for injecting the sealing gas to the gas holding vessel 28, an opening/closing valve 42 provided in the middle of the conduit 40, and a conduit 32 for communicating the side of the pod lid 14a facing the wafer pod body 12 with the opposite side of the pod lid 14a, and a pressure valve 38 provided in the middle of the conduit 32.

In FIG. 4, when the opening/closing valve 42 is opened, the gas holding vessel 28 receives the sealing gas through the conduit 40. The conduit 40 is designed to be able to make connection with the attachment 18 of the lid opening/closing control means 22 through the pod lid shutting device 16a in order to transfer the sealing gas as supplied from the attachment 18 to the gas holding vessel 28. These procedures is conducted with the pod lid 14a being detached from the wafer pod body 12 and fixed to the pod lid shutting device 16a.

On the other hand, when the opening/closing valve 34 is opened, the sealing gas contained inside of the gas holding vessel 28 is injected to the wafer pod body 12 through the conduit 30. As explained above, since the sealing gas is held compressed in the gas holding vessel 28, the sealing gas flows by itself into the wafer pod body 12 through the conduit 30 with the opening/closing valve 34 being opened. The filter 36 serves to improve the purity of the sealing gas temporarily stored in the gas holding vessel 28 in advance of the injection to the wafer pod body 12. By this configuration, the purity of the semiconductor wafers 10 inside of the wafer pod body 12 can be furthermore improved. While the pressure in the wafer pod body 12 is gradually elevated as the sealing gas is flowing into the wafer pod body 12, the pressure valve is opened when the pressure in the wafer pod body 12 reach a certain level. The residual gas inside of the wafer pod body 12 is exhausted to the outside of the wafer pod through the conduit 32 when the pressure valve 38 is opened. As a result, after a predetermined time elapses, the residual gas inside of the wafer pod body 12 is completely replaced by the sealing gas. These procedures are conducted with the pod lid 14a being sealingly fixed to the wafer pod body 12.

The procedure as described above is preferably conducted in response to the opening action and the closing action of the pod lid 14a. Namely, when the pod lid 14a is detached from the wafer pod body 12, the opening/closing valve 42 is operated to open while the opening/closing valve 34 is operated to close, followed by the injection of the sealing gas to the gas holding vessel 28. Also, when the pod lid 14*a* is fixed to the wafer pod body 12, the opening/closing valve 34 is operated to open while the opening/closing valve 42 is operated to close, followed by the injection of the sealing gas to the wafer pod body 12. This is an effective sequence.

In accordance with the first embodiment of the present invention, therefore, it is proposed to control the opening/closing operation of the opening/closing valves 34 and 42 in response to the opening/closing operation of the pod lid 14*a*. In practice, the pod lid shutting device 16*a* for attaching and detaching the pod lid 14*a* is designed, for example, as described in the followings.

Figure 5:
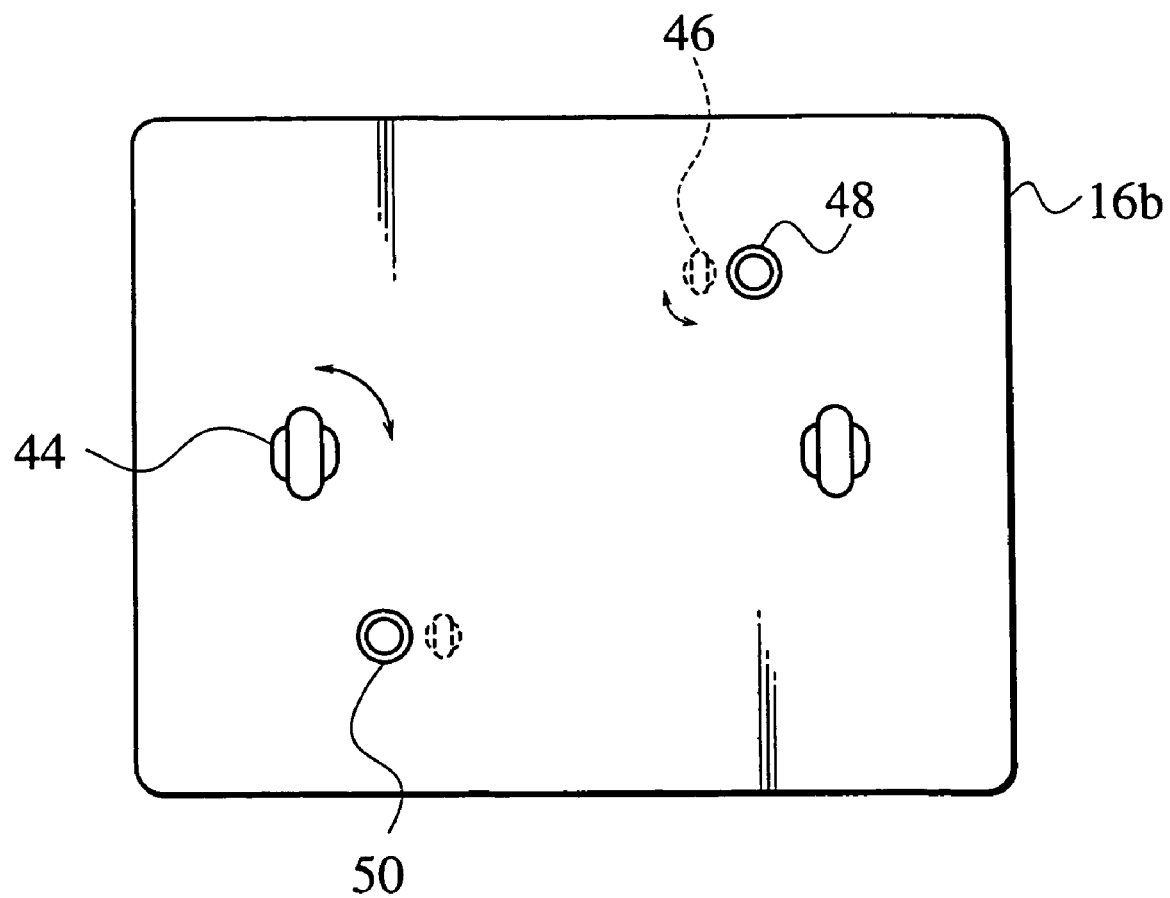
FIG. 5 is a plan view showing the configuration of the pod lid shutting device having been used in the prior art technique.
Figure 6A:
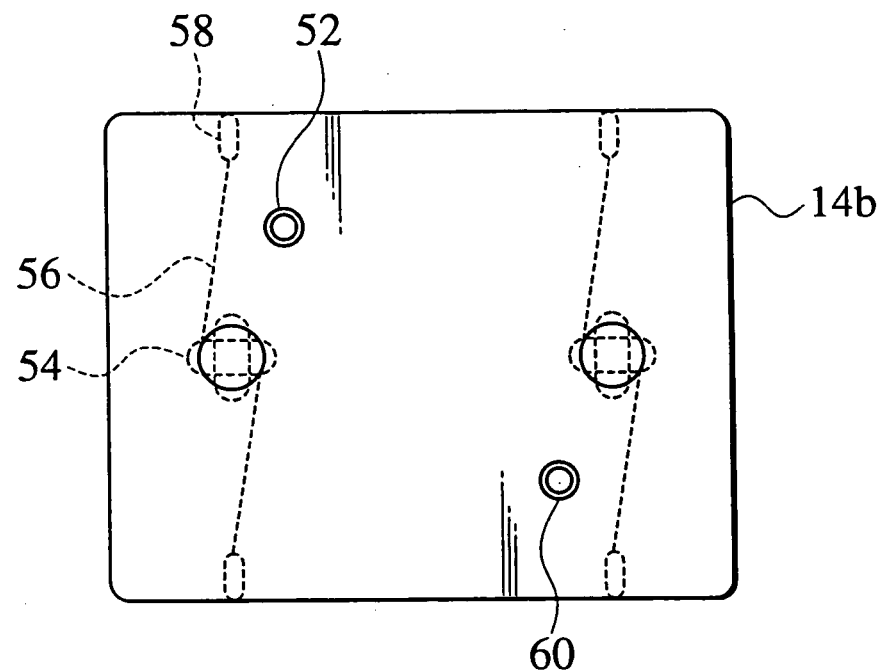
FIG. 6A is a plan view showing the configuration of the pod lid in accordance with the prior art technique.
Figure 6B:
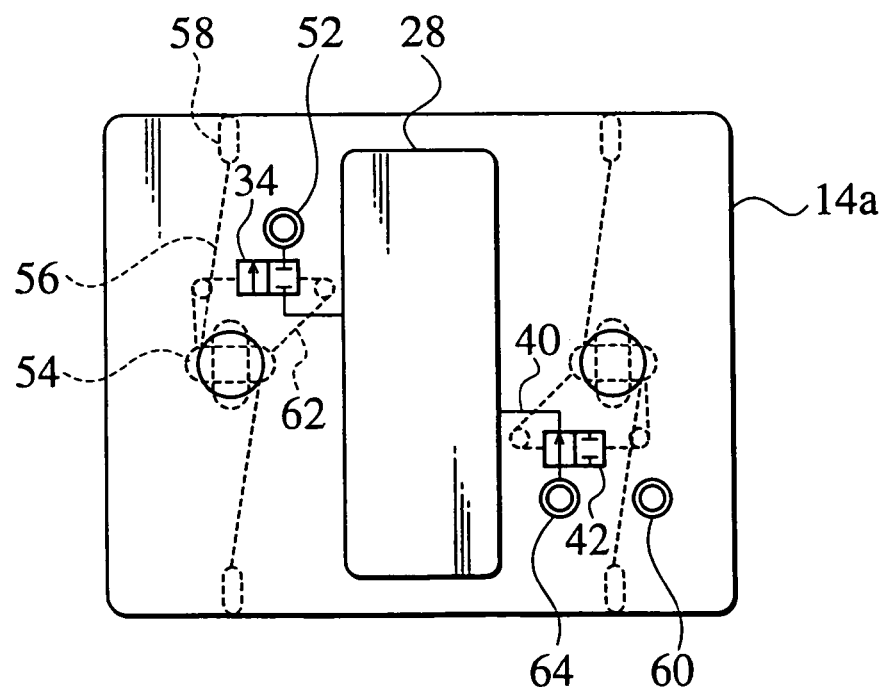
FIG. 6B is a plan view showing the configuration of the pod lid in accordance with the first embodiment of the present invention.

FIG. 5 is a plan view showing the configuration of the pod lid shutting device 16*b* having been used in the prior art technique. Also, FIG. 6A and FIG. 6B are plan views showing the configuration of the pod lid 14(14*a*, 14*b*). FIG. 6A is a plan view showing the configuration of the pod lid 14*b* in accordance with the prior art technique while FIG. 6B is a plan view showing the configuration of the pod lid 14*a* in accordance with the first embodiment of the present invention. As illustrated in FIG. 5, the pod lid shutting device 16*b* is provided with a locking/unlocking control mechanism 44, a gas injection connecting aperture 48 to which the attachment 18 is connected, a gas exhaustion connecting aperture 50 for exhausting the residual gas inside of the wafer pod body 12, and a valve opening/closing control mechanism 46 for controlling the opening/closing operation of the gas injection connecting aperture 48 and a gas exhaustion connecting aperture 50. Meanwhile, in accordance with the first embodiment of the present invention, there is no need for the gas exhaustion connecting aperture 50.

In accordance with the prior art technique, the opening/closing operation of the pod lid 14 is conducted by means of the locking/unlocking control mechanism 44 of the pod lid shutting device 16*b*. When the pod lid shutting device 16*b* is engaged with the pod lid 14*b*, the locking/unlocking control mechanism 44 is connected to the locking/unlocking mechanism 54 of the pod lid 14*b* as illustrated in FIG. 6A. The locking/unlocking mechanism 54 is rotated by turning the locking/unlocking control mechanism 44 in the same direction. Linking bars 56 serves to move locking pins 58 in the vertical direction when the locking/unlocking mechanism 54 rotates. The locking pins 58 are then projected from the pod lid 14*b* in order to sealingly fix the pod lid 14*b* to the wafer pod body 12. On the other hand, when the pod lid 14*b* is detached from the wafer pod body 12, the locking pins 58 are controlled to be drawn back into the pod lid 14*b*.

Furthermore, in accordance with the first embodiment of the present invention, the opening/closing valves 34 and 42 are controlled by making use of the locking/unlocking mechanism 54. As illustrated in FIG. 6B, in the case of the pod lid 14*a* according to this embodiment, the opening/closing operation of the opening/closing valves 34 and 42 is controlled by linking bars 62 when the locking/unlocking mechanism 54 rotates. More specifically speaking, when the locking pins 58 are drawn back into the pod lid 14*b* by means of the linking bars 56 in response to the rotation of the locking/unlocking mechanism 54, the linking bars 62 also serve to close the opening/closing valve 34 and open the opening/closing valve 42 at the same time. On the other hand, when the locking pins 58 are projected from the pod lid 14*b* by means of the linking bars 56 in response to the rotation of the locking/unlocking mechanism 54, the linking bars 62 also serve to open the opening/closing valve 34 and close the opening/closing valve 42 at the same time. By this controlling mechanism, when the pod lid 14*a* is detached from the wafer pod body 12, the injection of the sealing gas to the gas holding vessel 28 can be started with the opening/closing valve 42 being opened and the opening/closing valve 34 being closed. Also, when the pod lid 14*a* is fixed to the wafer pod body 12, the injection of the sealing gas to the wafer pod body 12 can be started with the opening/closing valve 42 being closed and the opening/closing valve 34 being opened.

In accordance with the first embodiment of the present invention, the pod lid 14*a* is implemented with the gas holding vessel 28 so that the sealing gas can be injected to the gas holding vessel 28 during the period after the semiconductor wafers 10 are carried out from the wafer pod body 12 and before the semiconductor wafers 10 are carried in the wafer pod body 12. The sealing gas having been injected to the gas holding vessel 28 is then transferred to the wafer pod body 12 during the transportation of the wafer pod. By this configuration, the sealing gas injection step to the wafer pod body 12 can be recognized to virtually disappear. Accordingly, there is no need for an extra time as required to inject the sealing gas to the wafer pod body 12 so that the transportation of the wafer pod can be accelerated by the extra time which has been dispensed with. As a result, the cycle time required for completing all the manufacture process can be shortened to realize the improvement of the production efficiency and the reduction of the production cost.

Figure 7A:
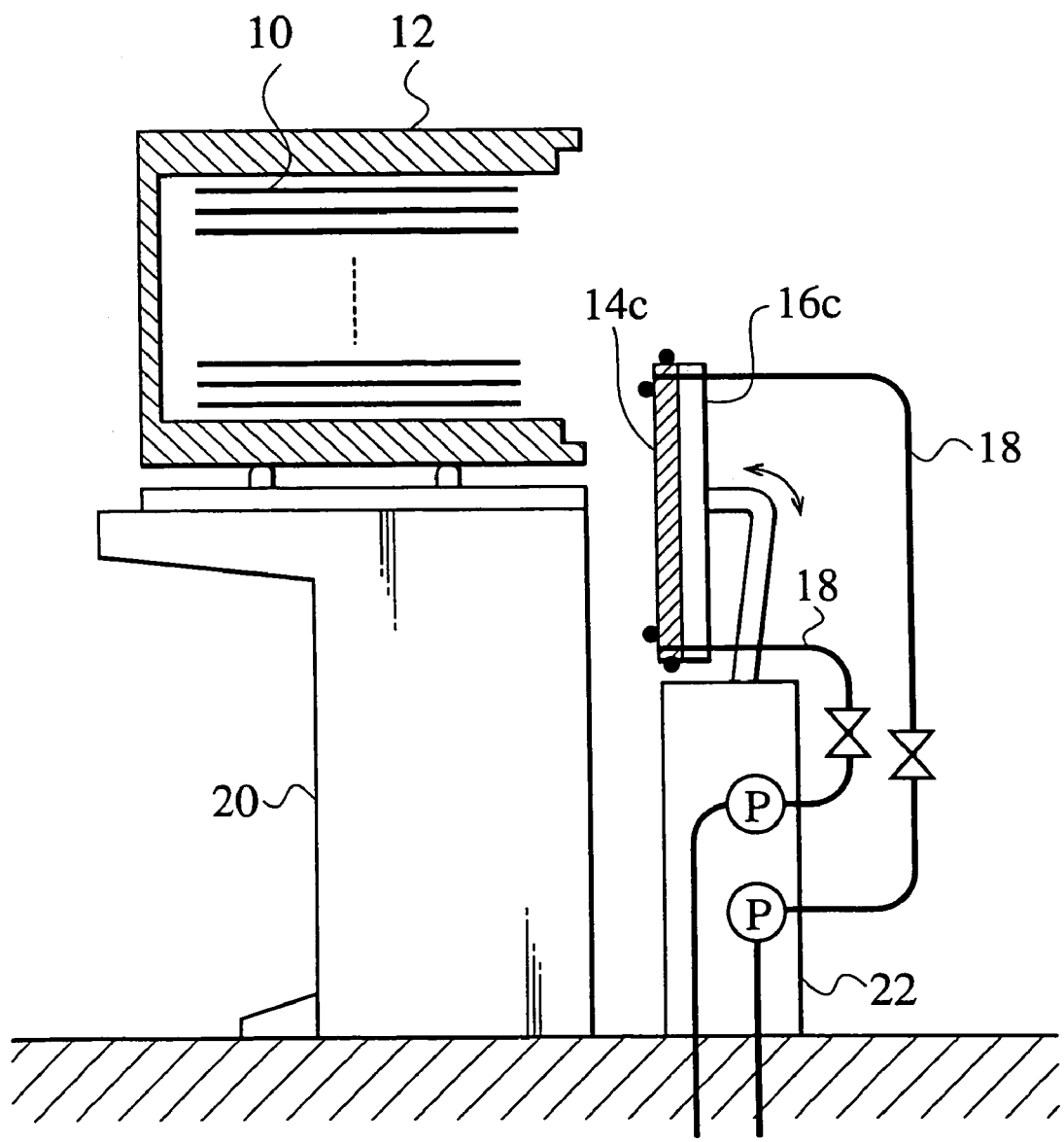
FIG. 7A is a schematic diagram the procedure of transferring semiconductor wafers to a semiconductor process chamber from a semiconductor wafer transportation pod in accordance with an exemplary modification of the first embodiment of the present invention.
Figure 7B:
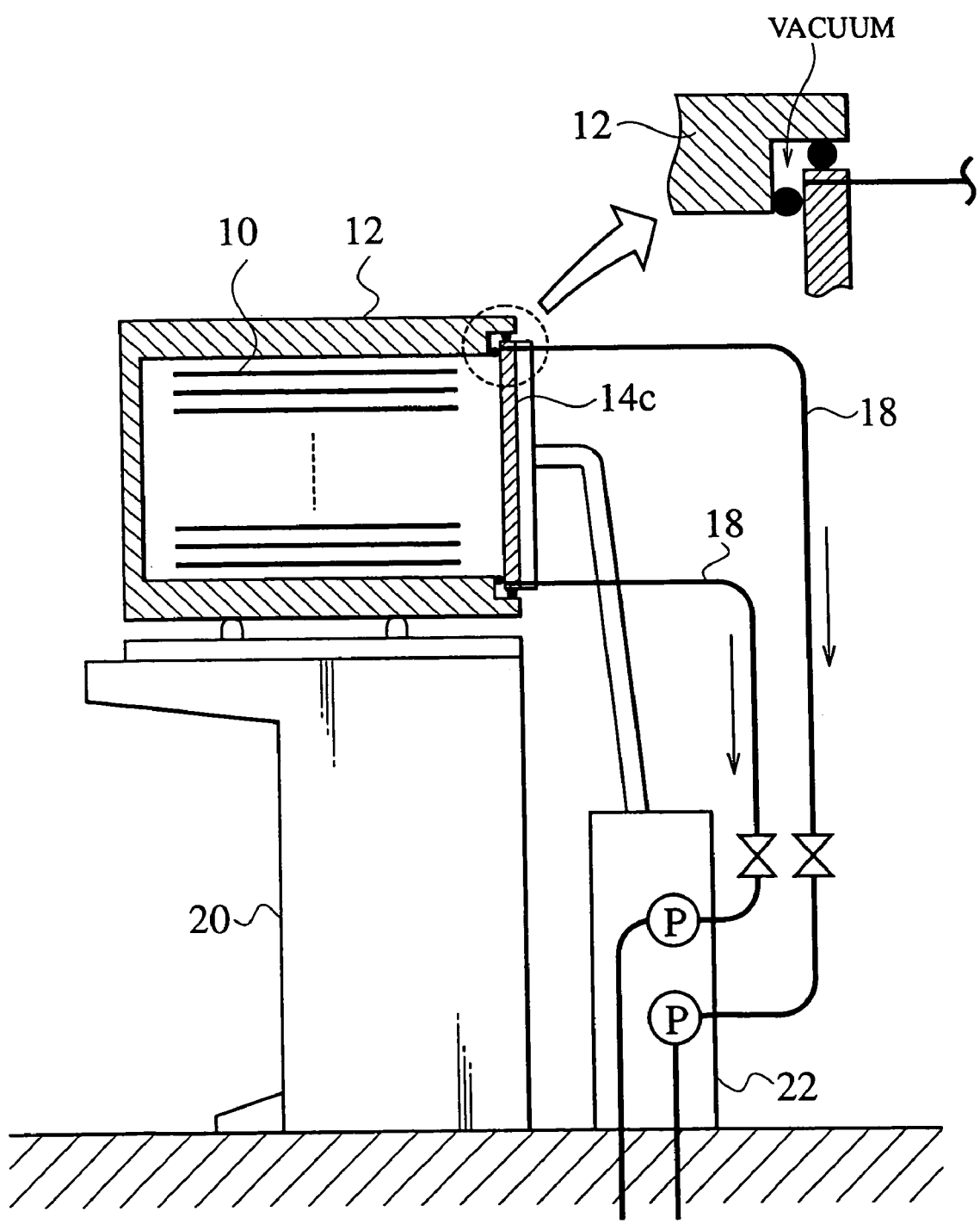
FIG. 7B is a schematic diagram showing the procedure of exhausting the space defined between two rubber gaskets and the contact surface in accordance with the exemplary modification of the first embodiment of the present invention.

Next, an exemplary modification of the first embodiment of the present invention will be explained. This exemplary modification is described to show an example which is capable of improving the sealing ability of the wafer pod by enhancing the sealable connection of the pod lid 14*a* to the wafer pod body 12 according to the first embodiment. FIG. 7A and FIG. 7B are schematic diagrams showing the wafer transportation by means of a semiconductor wafer transportation pod which is designed in accordance with this exemplary modification of the first embodiment of the present invention and placed on the wafer pod table 20 for carrying in or out the semiconductor wafers 10. As illustrated in FIG. 7A and FIG. 7B, in accordance with this exemplary modification, the pod lid 14*a* of the first embodiment is replaced by a pod lid 14*c* which is provided with two rubber gaskets on the contact surface at which the pod lid 14*c* comes into contact with the wafer pod body 12. Also, in accordance with this exemplary modification, the space defined between the two rubber gaskets and the contact surface is put at a pressure which is lower than the pressure of the atmosphere to some extent, i.e., "a negative pressure" as conventionally and technically expressed. The negative pressure is referred to as "vacuum condition" in the following description, unless otherwise described, for convenience.

FIG. 7B is a schematic diagram showing the procedure of exhausting the space defined between the two rubber gaskets and the contact surface by placing, on the wafer pod table 20, the semiconductor wafer transportation pod in accordance with this exemplary modification of the first embodiment of the present invention. As illustrated in FIG. 7B, in accordance with this exemplary modification, the space defined between the two rubber gaskets and the contact surface is evacuated in advance of the transportation of the wafer pod into which the semiconductor wafers 10 have been transferred. The evacuation of the space is performed by means of a vacuum pump P located on the lid opening/closing control means 22. The vacuum pump P is connected to the attachment 18, which is connected in turn to the conduit inside of the pod lid 14*c* through the pod lid shutting device 16*c*. Meanwhile, while the rubber gaskets are usually made of an O-ring whose cross section is circular, the rubber gaskets may be formed of a semicircular ring, rectangular ring and so on.

Figure 8A:
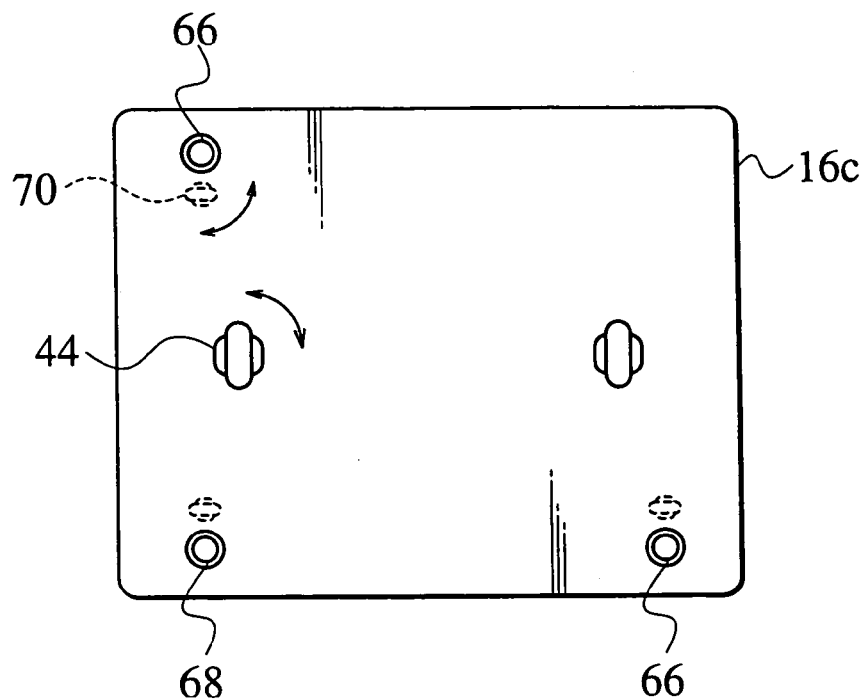
FIG. 8A is a plan view showing the configuration of the pod lid shutting device in accordance with the exemplary modification of the first embodiment of the present invention.
Figure 8B:
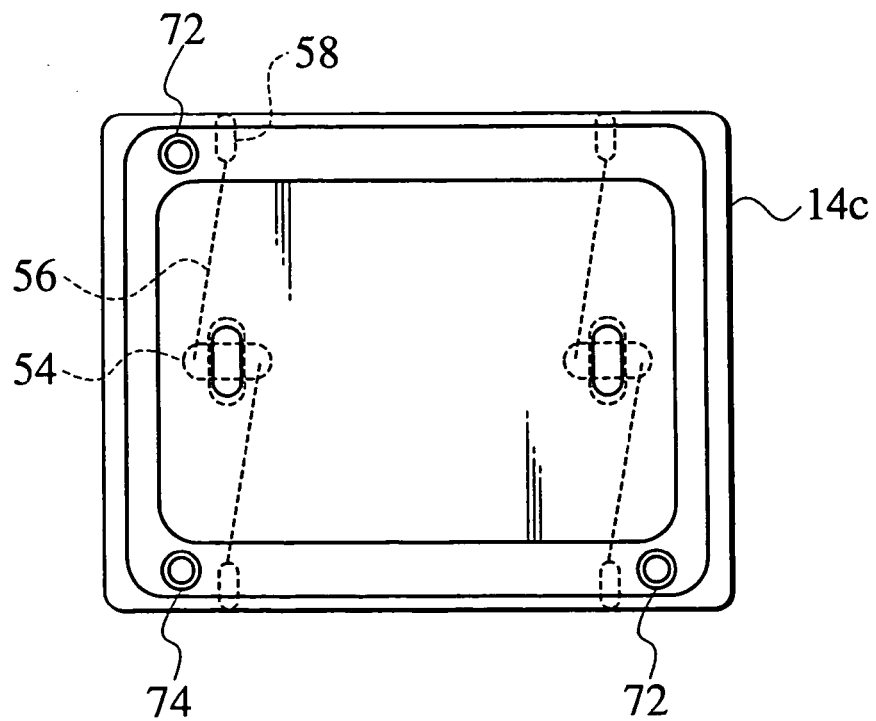
FIG. 8B is a plan view showing the configuration of the pod lid in accordance with the exemplary modification of the first embodiment of the present invention.

The pod lid shutting device 16c and the pod lid 14c in accordance with this exemplary modification are designed, for example, as illustrated in FIG. 8A and FIG. 8B. FIG. 8A is a plan view showing the configuration of the pod lid shutting device 16c in accordance with this exemplary modification. FIG. 8B is a plan view showing the configuration of the pod lid 14c in accordance with this exemplary modification. As illustrated in FIG. 8A, the pod lid shutting device 16c in accordance with this exemplary modification is provided with the locking/unlocking control mechanism 44 in the same manner as the first embodiment of the present invention, and also provided with gas inlet ports 66, a vent port connector 68, a valve opening/closing control mechanism 70 for controlling the opening/closing operation of the gas inlet ports 66 and the vent port connector 68. On the other hand, as illustrated in FIG. 8B, the pod lid 14c in accordance with this exemplary modification is provided with the locking/unlocking mechanism 54 and the linking bars 56 in the same manner as the first embodiment of the present invention, and furthermore provided with gas inlet port connectors 72 and a vent port 74. Also, the rubber gaskets made of an O-ring are attached to the contact surface between the pod lid 14c and the wafer pod body 12. When the pod lid 14c and the pod lid shutting device 16c are aligned with each other, the gas inlet port connectors 72 of the pod lid 14c and the gas inlet ports 66 of the pod lid shutting device 16c are coupled with each other while the vent port 74 of the pod lid 14c and the vent port connector 68 of the pod lid shutting device 16c are coupled with each other. The evacuation of the space is performed from the gas inlet ports 66 by means of the vacuum pump P through the attachment 18. On the other hand, when the pod lid 14c is detached from the wafer pod body 12, the space is vented to the atmosphere by passing air from the vent port 74 through the vent port connector 68.

In the case of the modification of the first embodiment of the present invention, the sealing ability of the pod lid 14c to the wafer pod body 12 is effectively enhanced in addition to the advantages of the first embodiment. Accordingly, the airtightness of the wafer pod is improved so as to elevate the purity of the interior of the wafer pod. Also, the loss of the sealing gas as contained in the wafer pod can be effectively avoided. By this configuration, it is possible to maintain the semiconductor wafers 10 in a highly purified environment to protect the semiconductor wafers 10 from generation of natural oxide films.

Second Embodiment

Next, the second embodiment of the present invention will be explained. The second embodiment of the present invention is described to show an example which is capable of improving the sealing ability of the wafer pod and also improving the leak-proof structure of the wafer pod by evacuating the interior of the wafer pod into a vacuum condition.

Figure 9A:
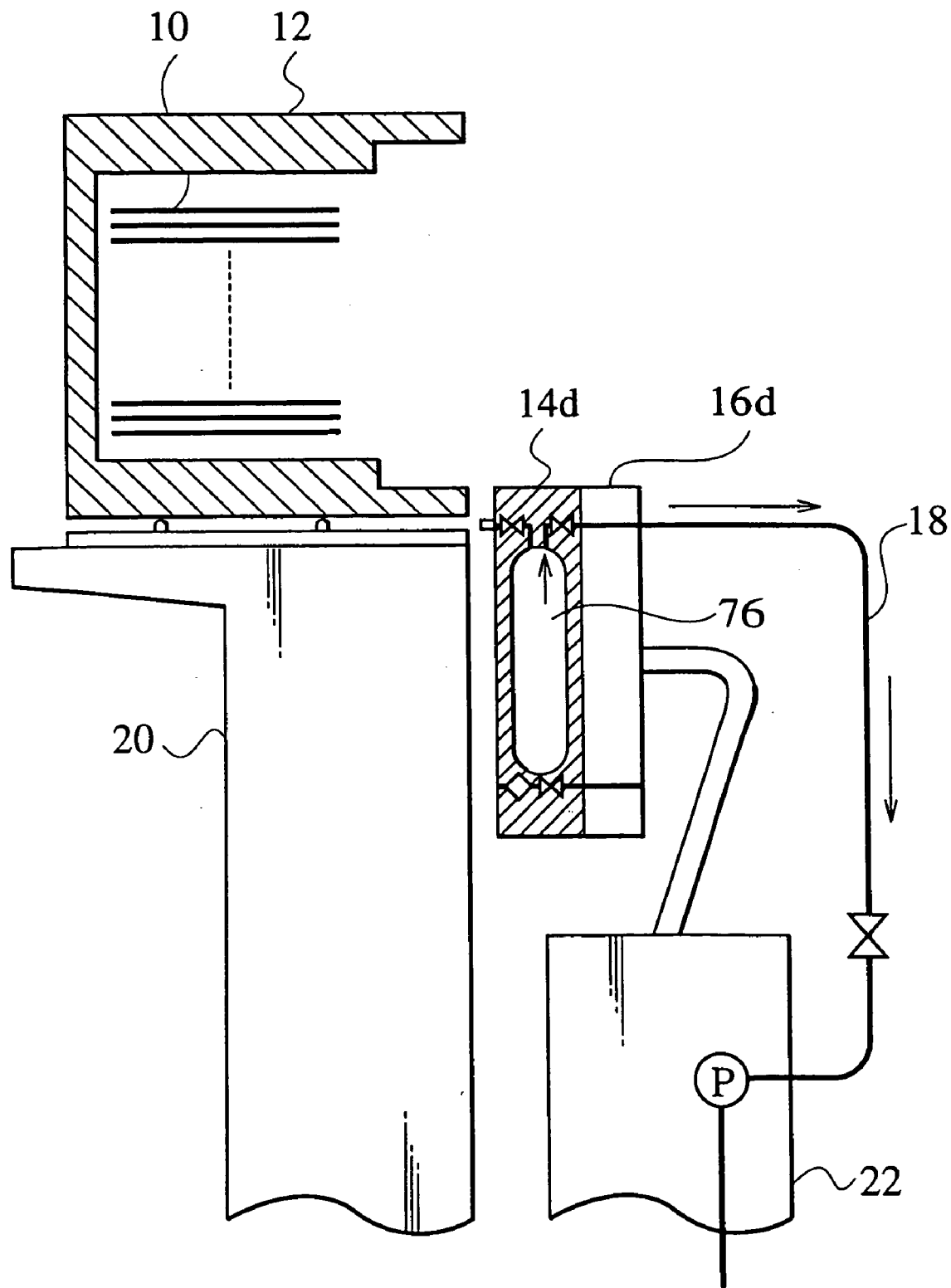
FIG. 9A is a schematic diagram the procedure of transferring semiconductor wafers to a semiconductor process chamber from a semiconductor wafer transportation pod in accordance with a second embodiment of the present invention.
Figure 9B:
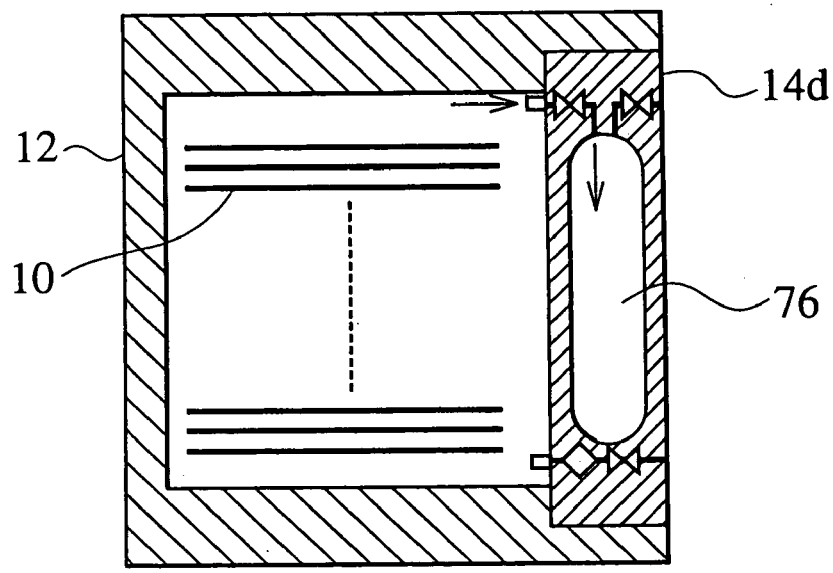
FIG. 9B is a schematic diagram showing the semiconductor wafer transportation pod in accordance with the second embodiment of the present invention which is transported between the process chambers.

FIG. 9A is a schematic diagram showing the wafer transportation by means of a semiconductor wafer transportation pod in accordance with the second embodiment of the present invention which is placed on a wafer pod table 20 for carrying in or out the semiconductor wafers 10. FIG. 9B is a schematic diagram showing the semiconductor wafer transportation pod in accordance with the second embodiment of the present invention which is transported between the process chambers. As illustrated in FIG. 9A, in the case of the semiconductor wafer transportation pod according to the second embodiment of the present invention, the pod lid 14a according to the first embodiment is replaced by a pod lid 14d which has a different configuration.

The pod lid 14d in accordance with the second embodiment of the present invention is provided with a vacuum chamber 76 located within the pod lid 14d. The vacuum chamber 76 is evacuated in advance for the purpose of evacuating the wafer pod body 12. In the first step, the evacuation of the vacuum chamber 76 is performed by the lid opening/closing control means 22. The attachment 18 is then connected to a conduit located inside of the pod lid 14d through a pod lid shutting device 16d by means of the lid opening/closing control means 22 after detaching the pod lid 14d implemented with the vacuum chamber 76 from the wafer pod body 22. The attachment 18 is connected to a vacuum pump P provided for the lid opening/closing control means 22 so that the evacuation of the vacuum chamber 76 is performed by means of the vacuum pump P. A vacuum is formed in the vacuum chamber 76 by this procedure. On the other hand, as illustrated in FIG. 9B, the vacuum chamber 76 serves in turn to evacuate the wafer pod body 12 during the transportation of the wafer pod. The interior of the wafer pod body 12 is therefore rendered to be in a vacuum condition after a certain time elapses.

Next, the operation of the second embodiment of the present invention will be explained with reference to FIG. 9A and FIG. 9B. The operation of the second embodiment of the present invention consists generally of the following two operations.

(1) Evacuation of the vacuum chamber 76.
(2) Evacuation of the wafer pod body 12.

Firstly, in accordance with the second embodiment of the present invention, the procedure of the evacuation of the vacuum chamber 76 is performed during the step of carrying out the semiconductor wafers 10 from the wafer pod body 12, the step of processing the semiconductor wafers 10 and the step of carrying the semiconductor wafers 10 into the wafer pod body 12 as illustrated in FIG. 9A. In the prior art technique, the pod lid 14d is left supported by the pod lid shutting device 16d without any operation during the step of carrying out, the step of processing the semiconductor wafers 10 and the step of carrying in. On the other hand, in accordance with the second embodiment of the present invention, the vacuum chamber 76 is evacuated in parallel with these steps. The evacuation can be completed within the step of processing the semiconductor wafers 10. Accordingly, there is no need for an extra time as required to evacuate the vacuum chamber 76.

Next, as illustrated in FIG. 9B, the evacuation (2) of the wafer pod body 12 is then performed during the transportation of the wafer pod. The wafer pod is transported to the next process chamber used in the subsequent manufacturing step by means of an appropriate transportation system (not shown in the figure) after transferring the semiconductor wafers 10 to the wafer pod. The vacuum chamber 76 as evacuated is then functioning to evacuate the interior of the wafer pod body 12 during the transportation. Since the vacuum chamber 76 is in a vacuum condition, the gas inside of the wafer pod body 12 is transferred to the vacuum chamber 76 through the appropriate conduit by its pressure when the appropriate valve is opened. The evacuation time for evacuating the wafer pod body 12 is about several second or several minutes in the case that the semiconductor wafer transportation pod has been designed to accommodates 25 wafer having a diameter of 300 mm. Accordingly, from the overall view point, the evacuation step can be recognized as completed just after starting the transportation of the wafer pod.

In the case of the first embodiment of the present invention, the evacuation of the wafer pod body 12 is conducted before the transportation of the wafer pod. Because of this, the transportation of the wafer pod is delayed by the evacuation time. In the case of the second embodiment of the present invention, the evacuation of the wafer pod body 12 is performed during the transportation of the wafer pod. By this configuration, there is virtually no additional time required for the evacuation of the wafer pod body 12.

Furthermore, in the case of the second embodiment of the present invention, it is possible to improve the leak-proof structure of the wafer pod. Generally speaking, the pressure P1(t) in a sealed box after evacuation is expressed by the following equation, $$P1(t)=(Q/V) \times t + P0(t)$$

where "V" is the volume of the box; "Q" is the leak volume; and "P0(t)" is the pressure just after evacuation.

Figure 10:
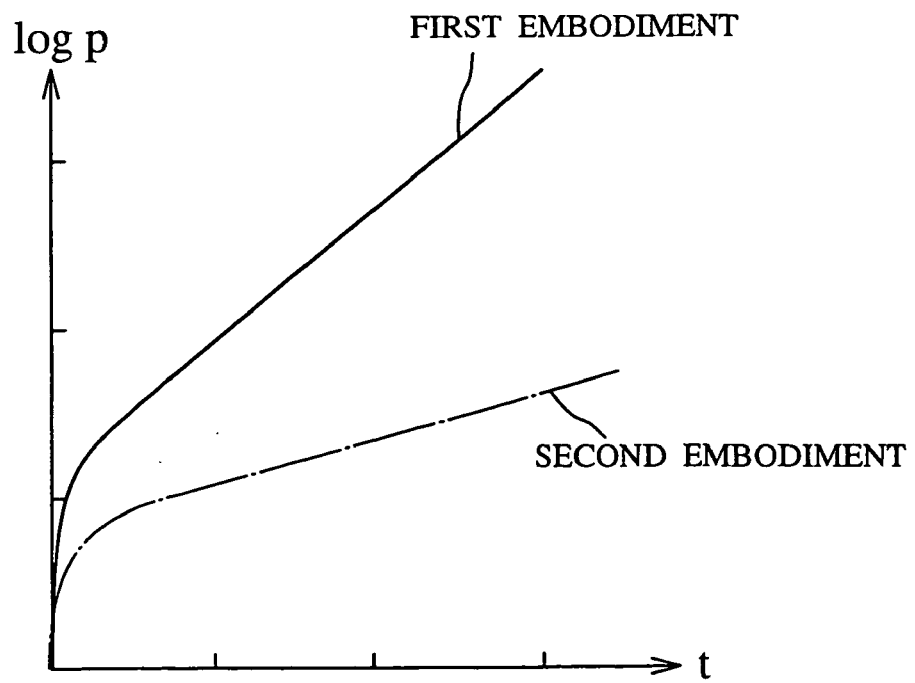
FIG. 10 is a graphical diagram showing the leak-proof characteristic in the case of the second embodiment of the present invention in contrast to the leak-proof characteristic in the case of the modification of the first embodiment of the present invention.

As understood from the equation as described above, the increase in the pressure of P1(t) in the sealed box is kept limited to a smaller level as the volume V of the sealed box is larger even in the case that the leak volume becomes substantial. Namely, the leak-proof characteristic of the sealed box is furthermore improved, as the volume of the sealed box is larger, in order to elongate the time for which the sealed box is maintained in a vacuum condition. FIG. 10 is a graphical diagram showing the leak-proof characteristic in the case of the second embodiment of the present invention in contrast to the leak-proof characteristic in the case of the modification of the first embodiment of the present invention. In the case of the modification of the first embodiment, what is evacuated is the tiny space defined between the two rubber gaskets and the contact surface as illustrated in FIG. 7B. However, in the case of the second embodiment of the present invention, all the spaces of the vacuum chamber 76 and interior of the wafer pod body 12 are rendered to be in a vacuum condition so that a higher leak-proof characteristic can be obtained. Accordingly, in accordance with the second embodiment, it is possible to maintain the sealed structure of the wafer pod for a longer time and therefore the semiconductor wafers 10 as stored in the wafer pod can be maintained in a highly purified environment even if the transportation requires a longer time. Also even in the case that the wafer pod is temporarily stored in a stocker, the semiconductor wafers 10 can be maintained in a highly purified environment in the same manner.

Figure 11A:
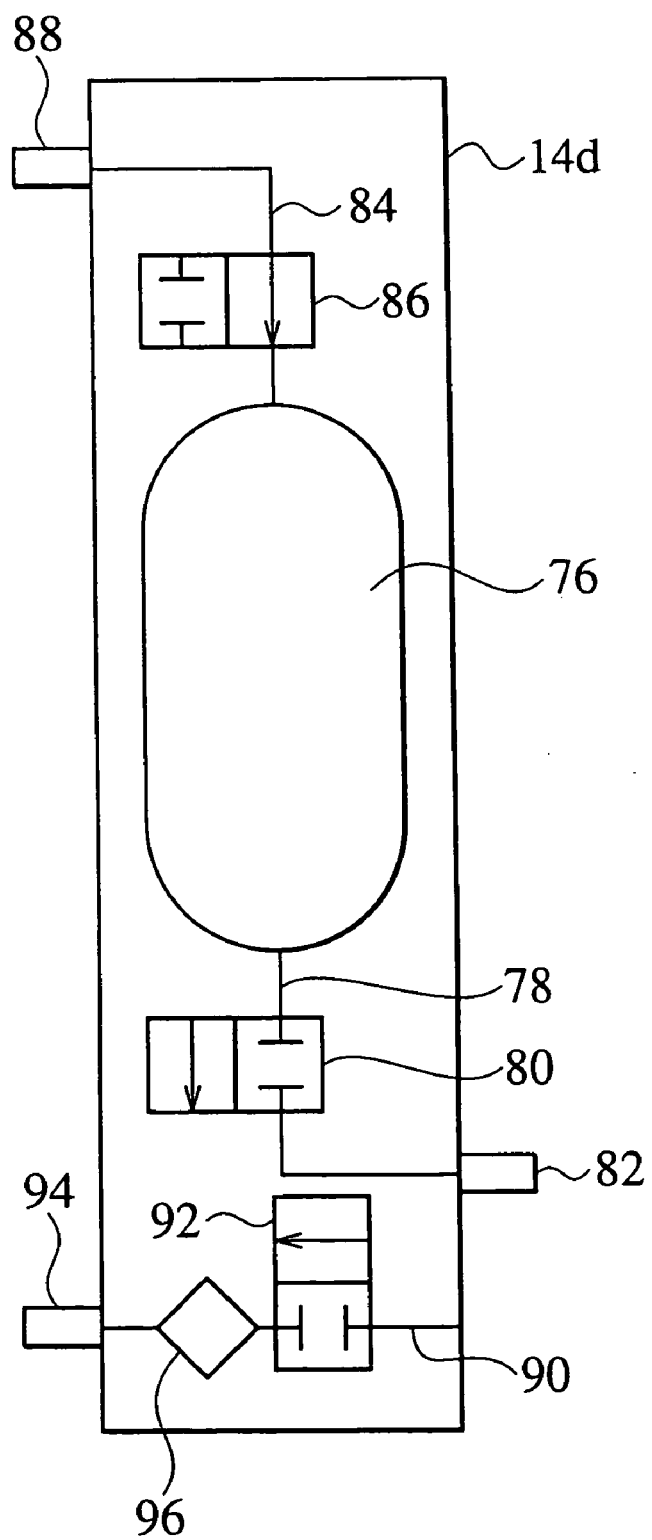
FIG. 11A is a cross sectional view showing the configuration of the pod lid in accordance with the second embodiment of the present invention.

The pod lid 14d in accordance with the second embodiment of the present invention is designed for example as illustrated in FIG. 11A. FIG. 11A is a cross sectional view showing the configuration of the pod lid 14d in accordance with the second embodiment of the present invention. As illustrated in FIG. 11A, the pod lid 14a in accordance with the second embodiment is composed therein of the vacuum chamber 76, a conduit 78 for evacuating the vacuum chamber 76, an opening/closing valve 80 located in the middle of the conduit 78, a conduit 84 for drawing the gas inside of the wafer pod body 12 into the vacuum chamber 76, an opening/closing valve 86 located in the middle of the conduit 84, a conduit 90 for communicating the side of the pod lid 14d facing the wafer pod body 12 with the opposite side of the pod lid 14d, and an opening/closing valve 92 and a filter 96 which are located in the middle of the conduit 90. In FIG. 11A, when the opening/closing valve 80 is opened, the vacuum chamber 76 is evacuated through the conduit 78 by means of the vacuum pump P as illustrated in FIG. 9A. The conduit 78 inside of the vacuum chamber 76 is then communicating with an inlet port 82, which is connected to the attachment 18 provided for the lid opening/closing control means 22 through the pod lid shutting device 16d. These procedures is conducted with the pod lid 14d detached from the wafer pod body 12 and fixed to the pod lid shutting device 16a.

On the other hand, when the opening/closing valve 86 is opened, the vacuum chamber 76 serves to evacuate the wafer pod body 12 through the conduit 84. As described above, since the vacuum chamber 76 is in a vacuum condition, the gas inside of the wafer pod body 12 is transferred to the vacuum chamber 76 through the conduit 84 when the opening/closing valve 86 is opened.

Meanwhile, when the pod lid 14d is detached from the wafer pod body 12, the wafer pod body 12 and the vacuum chamber 76 are vented to the atmosphere by passing air from the conduit 90. Air is introduced to the wafer pod from the vent port 94 through the conduit 90 when the opening/closing valve 96 is opened. Furthermore, the filter 96 is provided for the purpose of improving the purity of air as introduced to the wafer pod body 12. By this configuration, the purity of the semiconductor wafers 10 inside of the wafer pod body 12 can be maintained in a highly purified environment.

The procedure as described above is preferably conducted in response to the opening action and the closing action of the pod lid 14d. Namely, the evacuation of the vacuum chamber 76 is started when the pod lid 14d is detached from the wafer pod body 12 while the evacuation of the wafer pod body 12 is started when the pod lid 14d is attached again to the wafer pod body 12. In accordance with the second embodiment of the present invention, therefore, it is proposed to perform two operations in response to the opening/closing operation of the pod lid 14d.

Figure 11B:
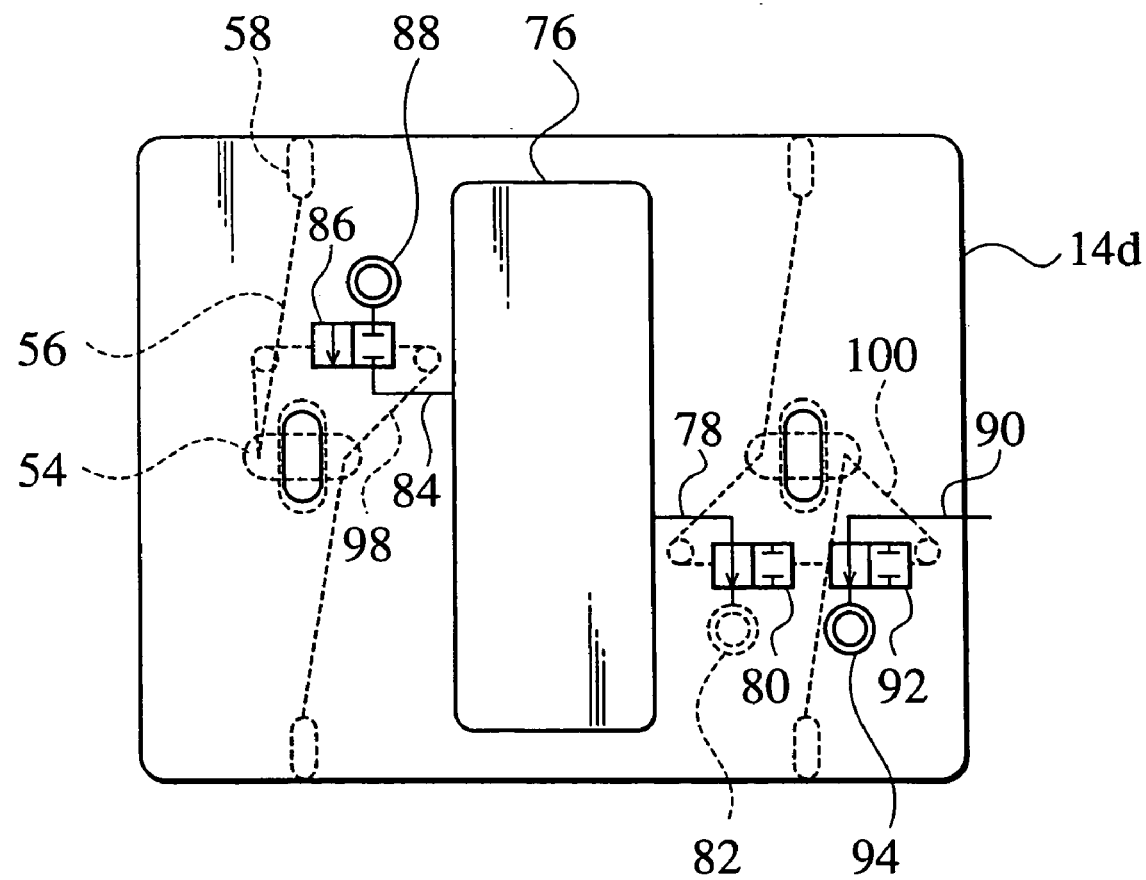
FIG. 11B is a plan view showing the configuration of the pod lid in accordance with the second embodiment of the present invention.

In practice, the pod lid 14d is designed, for example, as described in FIG. 11B. FIG. 11B is a plan view showing the configuration of the pod lid 14d in accordance with the second embodiment of the present invention. As illustrated in FIG. 11B, in accordance with the pod lid 14d of the second embodiment, the opening/closing operation of the opening/closing valves 80, 86 and 92 is performed by linking bars 98 and 100 in response to the rotation of the locking/unlocking mechanism 54. More specifically speaking, when the locking pins 58 are drawn back into the pod lid 14d by means of the linking bars 56 in response to the rotation of the locking/unlocking mechanism 54, the linking bar 98 serves to close the opening/closing valve 86 while the linking bar 100 serves to open the opening/closing valves 80 and 92 at the same time. On the other hand, when the locking pins 58 are projected from the pod lid 14d by means of the linking bars 56 in response to the rotation of the locking/unlocking mechanism, the linking bar 98 serves to open the opening/closing valve 86 while the linking bar 100 serves to close the opening/closing valves 80 and 92 at the same time. Accordingly, when the pod lid 14d is detached from the wafer pod body 12, it is possible to start venting the wafer pod body 12 and evacuating the vacuum chamber 76 with the opening/closing valves 80 and 92 being opened and the opening/closing valve 86 being closed. On the other hand, when the pod lid 14d is fixed to the wafer pod body 12, the evacuation of the wafer pod body 12 is started with the opening/closing valves 80 and 92 being closed and the opening/closing valve 86 being opened.

In accordance with the second embodiment of the present invention, the pod lid 14*d* is provided with the vacuum chamber 76 so that the vacuum chamber 76 is evacuated in advance during the period after the semiconductor wafers 10 are carried out from the wafer pod body 12 and before the semiconductor wafers 10 are carried in the wafer pod body 12 while the wafer pod body 12 is then evacuated by means of the vacuum chamber 76 during the transportation of the wafer pod. By this configuration, the evacuation step of the wafer pod body 12 can be recognized to virtually disappear. Accordingly, there is no need for an extra time as required for the evacuation of the wafer pod body 12. As a result, the cycle time required for completing all the manufacture process can be shortened to realize the improvement of the production efficiency and the reduction of the production cost. Furthermore, in accordance with the second embodiment, it is possible to maintain the sealed structure of the wafer pod for a longer time and therefore the semiconductor wafers 10 as stored in the wafer pod can be maintained in a highly purified environment for a longer time.

While the gas holding vessel and the vacuum chamber are described as implemented within the pod lid in accordance with the first and second embodiments of the present invention, it is possible to make use of the structure in which the gas holding vessel and the vacuum chamber are implemented in any other suitable location. For example, the gas holding vessel and the vacuum chamber may be implemented within the wafer pod body. Furthermore, not limited to the built-in structure, the gas holding vessel and the vacuum chamber are separately designed to be freely attached or detached to certain positions of the wafer pod.

Various modifications will become possible for those skilled in the art after receiving the teachings of the present disclosure without departing from the scope thereof.

What is claimed is:

1. A transportable container for sealingly enclosing substrates, the container comprising:
   a) a box having an opening and receiving the substrates therein;
   b) a removable closure member for received by the box and capable of closing the box; and
   c) an exhaustion system temporarily having a low pressure space whose pressure is lower than a pressure of a surrounding environment outside the container for exhausting a gas from an interior of the box by connecting the low pressure space to the interior of the box.

2. The container recited in claim 1, wherein the exhaustion system including:
   i) a vacuum chamber in which the low pressure space is formed; and
   ii) a first line for connecting the vacuum chamber to the interior of the box.

3. The container recited in claim 2, wherein the exhaustion system further including;
   iii) a second line for connecting the vacuum chamber to a vacuum pump located outside the container; and
   iv) a third line for supplying external air to the interior of the exhausted box.

4. The container recited in claim 2, wherein the exhaustion system serves to lower a pressure inside the vacuum chamber when the closure member is detached from the box, and connect the vacuum chamber and the interior of the box when the closure member is attached to the box.

5. The container recited in claim 4, wherein the exhaustion system serves to start the exhaustion of the vacuum chamber when the closure member is detached from the box, and start the exhaustion of the interior of the box when the closure member is attached to the box.

6. The container recited in claim 2, wherein the exhaustion system is located within the closure member.

7. The container recited in claim 2, wherein the exhaustion system is located on either of side walls, a top wall and a bottom wall of the box.

8. The container recited in claim 1, wherein the container is a SMIF (standard mechanical interface) apparatus.

9. The container recited in claim 1, wherein the box adapted to store a cassette, the cassette capable of holding the substrates.

* * * * *